(12) United States Patent
Liu et al.

(10) Patent No.: US 6,442,033 B1
(45) Date of Patent: Aug. 27, 2002

(54) LOW-COST 3D FLIP-CHIP PACKAGING TECHNOLOGY FOR INTEGRATED POWER ELECTRONICS MODULES

(75) Inventors: Xingsheng Liu; Guo-Quan Lu, both of Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 49 days.

(21) Appl. No.: 09/661,376

(22) Filed: Sep. 13, 2000

Related U.S. Application Data

(60) Provisional application No. 60/155,598, filed on Sep. 24, 1999, and provisional application No. 60/155,599, filed on Sep. 24, 1999.

(51) Int. Cl.[7] .................................................. H05K 7/06
(52) U.S. Cl. ...................... 361/743; 361/720; 361/768; 361/718; 257/707; 257/712; 174/52.1
(58) Field of Search ................................ 361/702–710, 361/719–720, 761–764, 728, 736, 767, 783, 803, 738–743; 257/706–727, 692, 737, 739, 778, 786, 788, 780; 174/259, 260, 252, 52.1, 52.3; 165/80.2, 80.3, 185; 438/666, 665, 119, 615, 127, 126, 108, 109; 437/209, 211; 228/180.22

(56) References Cited

U.S. PATENT DOCUMENTS

| | | | | |
|---|---|---|---|---|
| 5,222,014 A | * | 6/1993 | Lin | 361/414 |
| 5,551,627 A | * | 9/1996 | Leicht et al. | 228/180.22 |
| 5,784,261 A | * | 7/1998 | Pedder | 361/767 |
| 5,956,606 A | * | 9/1999 | Burnette | 438/615 |
| 5,994,166 A | * | 11/1999 | Akram et al. | 438/108 |
| 6,014,313 A | * | 1/2000 | Hesselbom | 361/704 |
| 6,057,612 A | * | 5/2000 | Temple | 307/150 |
| 6,088,236 A | * | 7/2000 | Tomura et al. | 361/783 |
| 6,125,039 A | * | 9/2000 | Suzuki | 361/720 |
| 6,304,450 B1 | * | 10/2001 | Dibene et al. | 361/704 |
| 6,324,072 B1 | * | 11/2001 | Lorenz et al. | 361/803 |

FOREIGN PATENT DOCUMENTS

JP 411289047 A * 10/1999 ......... H01L/25/065

* cited by examiner

*Primary Examiner*—Darren Schuberg
*Assistant Examiner*—Michael Datskovsky
(74) *Attorney, Agent, or Firm*—Whitham, Curtis & Christofferson, PC

(57) ABSTRACT

Resistance and parasitic inductance resulting from interconnection of semiconductor chips in power modules are reduced to negligible levels by a robust structure which completely avoids use of wire bonds through use of ball bonding and flip-chip manufacturing processes, possibly in combination with chip scale packaging and hourglass shaped stacked solder bumps of increased compliance and controlled height/shape. Turn-off voltage overshoot is reduced to about one-half or less than a comparable wire bond packaged power module. Hourglass shaped solder bumps provide increased compliance and reliability over much increased numbers of thermal cycles over wide temperature excursions.

10 Claims, 4 Drawing Sheets

LOW-COST 3D FLIP-CHIP PACKAGING TECHNOLOGY FOR INTEGRATED POWER ELECTRONICS MODULES

This application claims the benefit of provisional applications Nos. 60/155,598 and 60/155,599, both filed on Sep. 24, 1999.

BACKGROUND OF THE INVENTION

1. Field of the Invention

The present invention generally relates to packaging of semiconductor integrated circuits for medium-level power applications such as inverters for motor drives and convertors for processing equipment and, more specifically, to modular structures for power semiconductor devices and associated integrated circuits.

2. Description of the Prior Art

Virtually all semiconductor electronic devices from discrete diodes and transistors to integrated circuits of very high integration density require packaging or encapsulation for mechanical protection and support as well as thermal control. In digital logic devices, packaging has been developed quite extensively and is highly sophisticated at the present state of the art; often providing for multi-chip modules containing many interconnected chips or dies. Thermal control has been critical to support high switching speeds of such circuits which may include millions of active devices on a single chip.

However, development of packaging for semiconductor power control devices, referred to as power modules, has not kept pace with the development of packaging for digital circuits and, moreover, requires consideration of a much wider variety of operating conditions and device characteristics than for digital processing and memory circuits having relatively low power requirements and which are not required to deliver significant power levels to an external device. That is, low power digital circuit packaging is principally concerned with reduction of signal propagation time (generally by minimization of signal path length), noise immunity and heat dissipation while there is a trend toward reduction of voltages representing logic states. In sharp contrast, power modules may include one or more large chips of varying sizes which carry high currents and may switch rapidly (although generally at lower frequency than digital logic circuits) or operate in an analog fashion with dramatically different effects on distribution of generated heat and thermal cycling and further including packaging with low-power control and protection circuits. Connections to power chips also must carry large currents.

At the present time, most packaging for power modules is in one of the well-known forms of single in-line packages (SIP), dual in-line packages (DIP), small outline packages (SO/SOP) and quad flat packs (QFP) all of which have been known for a number of years, have high resistance and parasitics, poor thermal management and high cost. Further, because of the requirement for carrying high current, internal package connections (e.g. from package pin or lead frame to chip connection pads) have generally been formed with wire bonds. Wire bonds in power modules are not only subject to high resistance and noise but also parasitic oscillations, fatigue and eventual failure. That is, where the power modules are switching at high di/dt and dv/dt, the connections generate strong electromagnetic fields, resulting in proximity effects and uneven current distribution among bonding wires as well as excess parasitic inductance which can increase the voltages the devices must withstand as large currents are reduced at a rapid rate.

From the point of view of reliability, wire bonding has proven to be one of the weakest areas of power module packaging since high current requires thick 0.25–0.50 mm wires to be employed for wire bonds. One of the main failure mechanisms in high power devices such as insulated gate bipolar transistors (IGBT) modules subject to thermal cycling is wire bond lift-off due to the large coefficient of thermal expansion (CTE) mismatch between metal (e.g. aluminum) wires and silicon chips. Wire bonds may also be effectively damaged by the unavoidable deformation and working of the wire during the bonding process that may generate small dimensional differences that concentrate heat generation and mechanical stress. Motion of the wires to accommodate CTE mismatch during thermal cycling and due to proximity effects cumulatively contribute to fatigue of both the wire and the bond. Therefore, the mean time to failure of power modules is often foreshortened while increased service lifetimes are demanded (e.g. about thirty years) which cannot be achieved with current package technologies, especially including wire bonds.

In recent years, there has also been a demand for smaller power module packages, particularly for portable electronic products where higher power density and better efficiency are desired. Such power modules may increase requirements for control and protection integrated circuits including sensors to be packaged with the power devices. However, power semiconductor suppliers have been concentrating on improving device structure, density and process technology to lower on-resistance of MOSFETS and voltage drop of IGBTs.

Recent advances in these technologies are pushing packaging technology to the limits of performance in these power systems since the resistance and parasitics contribution of the package and wire bonds are now comparable to the values of resistance and inductance of current power chips. In summary, current packaging technology effectively limits performance of current power chips and recent technical developments have not provided overall improvements in performance while available packaging technology does not allow exploitation of the full potential of recent advances in power chips or to support future power chips.

SUMMARY OF THE INVENTION

It is therefore an object of the present invention to provide a new power semiconductor device packaging technology which exhibits reduced resistance and inductance and improved thermal performance and reliability at reduced cost.

It is another object of the invention to provide a generalized packaging structure for power modules which will support improved performance of the devices while accommodating inclusion of low power control and protection devices, including condition sensors.

It is a further object of the invention to provide a power semiconductor device packaging which includes chip scale packaging to reduce cost and improve performance.

It is yet another object of the invention to provide an improved solder bump structure and process for improving durability to withstand extreme thermal cycling over long periods of service.

In order to accomplish these and other objects of the invention, an integrated power electronic module is provided including a first multi-layer substrate, a second substrate having a power semiconductor device attached thereto with ball bonds, and an arrangement for assembling the first multi-layer substrate with the second substrate and the power semiconductor device such that the power semiconductor device is sandwiched between the first substrate and the second substrate.

In accordance with another aspect of the invention, a method of making a compliant solder bump structure is provided comprising steps of screening a paste containing a first solder material onto a surface to form an inner solder bump, placing a ball of a second solder material on the inner solder bump to form a middle solder bump, and reflowing the first solder material.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
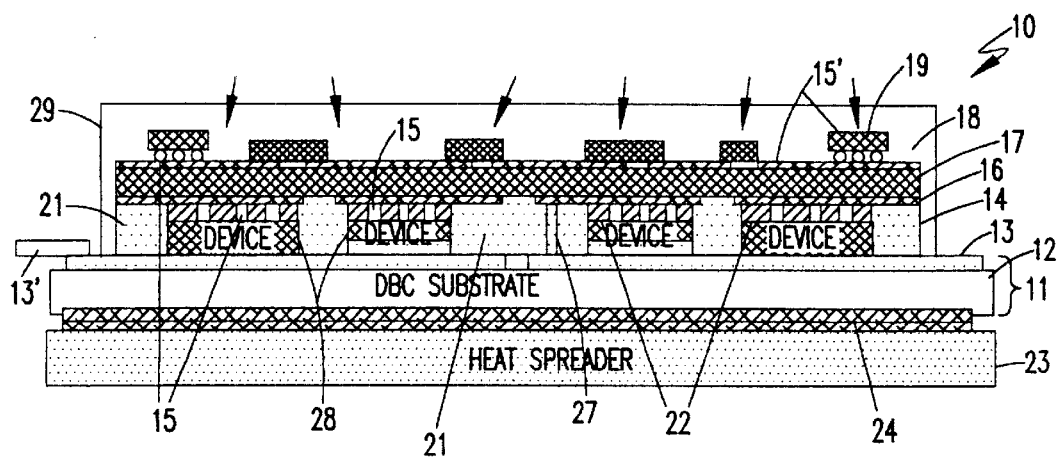
FIG. 1 is a cross-sectional view of a first embodiment of a package structure in accordance with the invention.

Referring now to the drawings, and more particularly to FIG. 1, there is shown a cross-sectional view of an integrated power electronic module (IPEM) packaging structure 10 in accordance with a first embodiment of the invention. This embodiment is considered to be preferred for many applications which do not require extreme heat transfer capabilities (although heat transfer capability can be increased by various known expedients) and where lateral extent of the package is an important design criterion.

The basic principle of the invention is to sandwich at least the power devices 14 between parallel compliant and/or flexible heat conductive plates (with suitable heat conductive encapsulation) which also serve as inter-chip wiring and the formation of connections with solder bumps. By doing so, wire bonds are eliminated with their associated parasitics and mechanical vulnerability and numerous additional paths for heat transfer and thermal control are provided.

Internal stresses due to CTE mismatch are regulated by temperature spreading and improved heat dissipation as well as through the use of compliant plates and compliant connections provided by the encapsulated solder bumps and the regulation of stresses by distribution through the encapsulant. Reliability and long service life are also addressed by solder bump geometry including aspect ratio and shape. It should be noted in this regard that many new technologies for eliminating wire bonds typically employ thin-film deposition techniques or plating which generally rely on expensive equipment and do not generally develop connections which are capable of carrying high currents or which raise problems of reliability for doing so.

It should also be recognized in the following discussion that the terms "flip-chip" (FC) and "chip scale packaging" (CSP) are known in regard to digital logic and storage devices. However, the processes and methodologies referred to by such terms hereinafter should be regarded as extensions of similar techniques to power devices, as will be described in detail, and which are not necessarily identical or even appropriate to digital logic and storage devices. In the context of the present invention, the term "flip-chip" is intended principally to connote that some assembly is performed to form a sub-assembly and the subassembly is inverted (relative to an arbitrary orientation convention or practice) for further processing and assembly. The term "chip scale packaging", in the context of the present invention, is intended principally to connote that interconnection and protection structures are applied at the chip level.

The first embodiment of FIG. 1 includes a first plate 11 including a heat conducting substrate such as Burquist board (a laminate comprising a relatively thick layer of aluminum 12, a thin layer of insulating polyimide or other dielectric and a layer 13 of copper of arbitrary thickness), direct bond copper (DBC) on both sides of an aluminum nitride (AlN) substrate which has a CTE closely matched to silicon or other insulated metal substrate. The metal layers should be sufficiently thick (and symmetrical) to provide adequate thermal and electrical conduction (while thin enough to avoid alteration of dimensional change with temperature of the assembly with aluminum nitride) and the insulator layers should be adequately thin to avoid compromise of thermal conduction between the metal layers.

The copper layer 12 may thus be patterned as required to provide interconnections, shielding and the like. The second plate comprises a layer of metal (e.g. copper) 16, an insulator layer 17 and a second metal (e.g. copper) layer 18. Both metal layers may be patterned as desired to form interconnections, shielding and the like, as well, and respective areas of metal layer 16 and metal layer 18 may be connected as desired by through hole metallizations or vias 17'.

The power devices are bonded to metal layer 16 using solder balls 15 and underfill 22 comprising a low viscosity material tending to wick into small voids is applied and which can later be cured by heat treatment at a temperature below the melting point of solder to a solid form having a relatively low elastic modulus compared to other polymers and close to that of solder (e.g. in the range of about 3–20 Gpa). A reasonably close match of elastic modulus provides a quasi-continuum at the solder interface and suppresses the stress concentration associated with sharp angles between the solder and die. the underfill material, after curing, should have a glass transition temperature well above the service temperature of the IPEM. Underfill materials having these properties and suitable for practice of the invention are commercially available.

The sub-assembly is "inverted" against patterned metal layer 13 such that the tallest of the power devices rest against surface 13 of the substrate 11 with voids filled with heat conductive viscous encapsulant which can be molded to conform to the shape of the void(s). Low-power sensor, control and protection devices 19 may be bonded with conventional solder bumps or other techniques such as ball bonds, solder preforms and the like, as desired or required, to the surface of patterned metal layer 18. Power connections 13' may be made to the margin of metal layer 13 extending beyond or though cover 29 or in any other convenient manner.

Respective areas of metal layers 13 and 16 may be connected as desired by vias or passive devices (e.g. resistors, capacitors, etc.) 27 or the substrates or CSP packages of devices 28. Passive components/devices can also be connected only to patterned regions of either of the first or second substrates. A heat spreader or heat sink 23 (such as a liquid cooled plate) can be attached to substrate 11 with adhesive 24 or any other suitable technique, if desired.

Viewing the structure of FIG. 1 as a whole, it is first seen that all wire bonds have been eliminated. The wide, short connections made with solder bumps have negligible or much reduced resistance and inductance compared with wire bonds and are highly compliant to relieve stress in the power devices, particularly if preferred solder bump structures, as will be described in detail below, are employed. Since the solder bump connections are substantially fully encapsulated, as will also be discussed in greater detail below, reliable connections are provided even at temperatures where the solder may be softened or molten. Thermal conduction paths are provided in three dimensions from all surfaces of the power devices 28 to the heat conductive plates 11 and 16–18 which serve to minimize temperature gradients throughout the IPEM and to develop a substantially uniform temperature throughout the IPEM while maximizing the heat transfer surface area of the IPEM. Stress in the power devices is also relieved by the compliance of the encapsulant 21 and underfill 22 and/or the compliance of the substrate 17 and CTE of the power chips and the substrate 17 (and substrate 11) can be closely matched. Thus electrical, mechanical and thermal performance of the IPEM in accordance with the invention are all significantly improved in comparison with known prior power device packaging structures.

Figure 2:
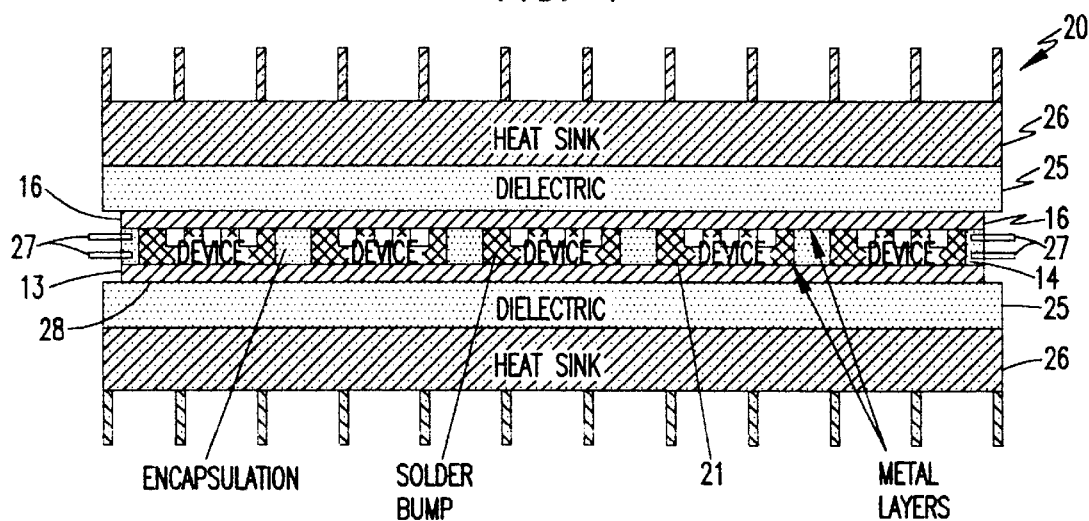
FIG. 2 is a cross-sectional view of a second embodiment of a package structure in accordance with the invention.

Referring now to FIG. 2, a second embodiment 20 of the invention will be described. This second embodiment 20 is considered to be preferred where substantially passive cooling capacity is of overriding importance and lateral dimensions are not critical. It should be recognized, however, that combinations of features of the first and second embodiments may be used together to satisfy the requirements of particular applications as will be evident to those of ordinary skill in the art in view of this description of preferred embodiments of the invention and that the first and second embodiments can be employed interchangeably for a wide variety of applications. Likewise, the choice between the first and second embodiments may be dictated by the environment rather than the application or a combination of the application and the intended environment.

The structure of FIG. 2 is similar to that of FIG. 1 except that metal layer 18 and underlying insulator 17 are omitted and low power sensor, control and/or protection circuits 19 can be mounted on patterned metal surfaces 13 and 16 in front of or behind the plane of the page. The patterned metal surfaces 13 and 16 are supported on dielectric layers 25 and heat distribution is enhanced by the encapsulant and the metal layers 13, 16 while the dielectric layer 25 is relatively thin and actual thermal resistance is acceptably low since the thermal paths are shortened relative to those of FIG. 1. Further, additional heat spreading is accomplished by the base of heat sinks 26 preferably applied to both sides of the package.

Moreover, but for the orientation of power devices 28, the structure is entirely symmetrical to further avoid the development of internal stresses. The orientation of the power devices is unimportant in view of the heat conduction and compliance of the encapsulant. As a perfecting feature of the second embodiment of the invention, all of the power device could be made or CSP packaging applied to develop a substantially uniform height for improved heat conduction to surface 13. Power bus connections 27 can be made through the encapsulation at any point on the periphery of the device or even through the heat sinks 26 and dielectric 25, if desired.

Figure 3A:
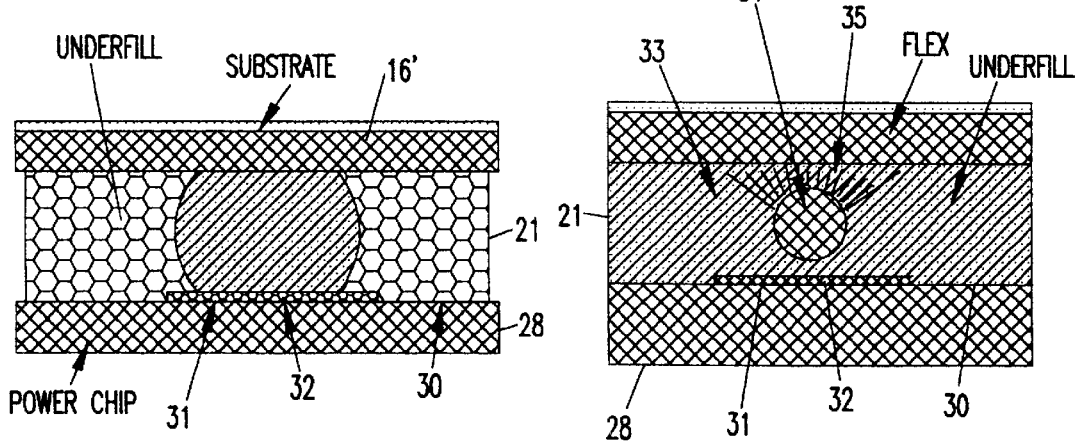
FIGS. 3A and 3B illustrate acceptable and preferred solder bump structures, respectively.
Figure 3B:
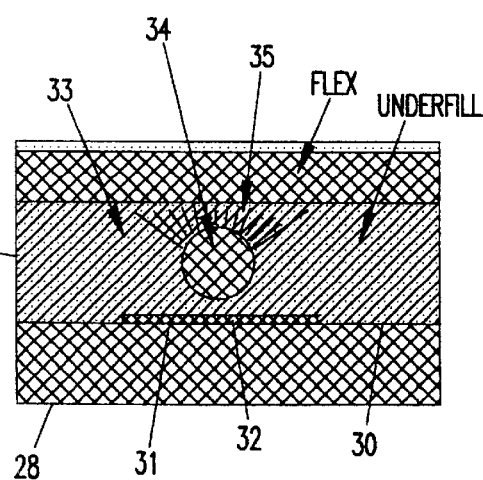

Referring now to FIGS. 3A, 3B acceptable and preferred forms of the solder balls will now be discussed. The solder ball form shown in FIG. 3A is conventional in topology but not necessarily in scale. The structure illustrated in FIGS. 3A and 3B include a passivation film on the surface of power device 28, as is customary. An aluminum pad 31 is formed in an aperture in the passivation film 30 to permit contact to a conductive area of the power device 28. Under-bump metallurgy (UBM) 32, preferably including a titanium layer for adhesion and nickel and copper layers to make solderable contacts, is then applied over the aluminum contact pad. This metallization controls the shape of the ball formed when solder materials, generally applied by screening in the form of a paste or plating, is reflowed to form a protruding ball-shaped solder bump.

When a substrate (e.g. 16' corresponding to metal layer 16) is brought into contact with the solder bump and heated, the solder ball partially reflows to form a broadened and shortened conductor bonding UBM 32 and device 28 to the surface 16'. However, it should be noted that a sharp corner remains at the interface of the solder ball and the bonding pads on the opposing surfaces. Although substantially relieved by underfill and encapsulant if the elastic moduli are reasonably well-matched in accordance with the invention, such sharp corners concentrate forces from shear due to CTE mismatch and may be nucleation points for solder cracking and lift-off. The height and width (e.g. aspect ratio) of the solder bump is also not easily controllable and the inventors have found that these parameters are extremely important to reliability over large numbers of thermal cycles, particularly over large temperature excursions as are encountered in power modules.

Referring to FIG. 3B, the same metallization structure 30, 31, 32 on the surface of power device 28. However, the solder bump is formed as a triple stacked solder bump in accordance with a feature of the invention. In a preferred form for use in the present invention, the inner bump 33 is Sn 96.5/Ag 3.5 alloy with a melting point of 221° C., the middle bump 34 is SN 10/Pb 90 alloy with a melting point of 268° C. and the external bump 35 is eutectic solder (Sn 63/Pb 37) with a melting point of 183° C. an are sequentially applied while the temperature is appropriately regulated. The overall height of the triple stacked solder bump is preferably about 10–40 mil and can be easily and readily regulated in accordance with the invention. The triple stacked solder bumps are of increased compliance due to their metallurgy and shape (an "hourglass" form of increased height) and thus have an increased capacity to relieve stress caused by CTE mismatch. Additionally, the triple stacked solder bump is much more reliable over a much increased number of thermal cycles due to reduction of force concentration at the interface between the solder and the silicon die or the substrate.

Figure 3C:
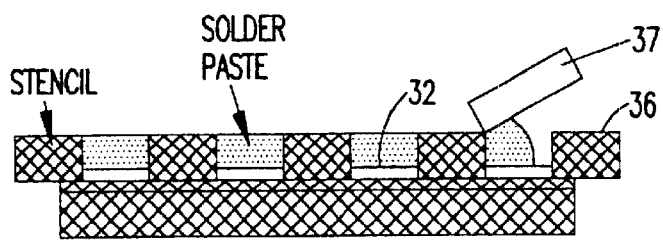
FIGS. 3C, 3D, 3E, 3F and 3G illustrate the process of forming the preferred solder bump of FIG. 3B.
Figure 3D:
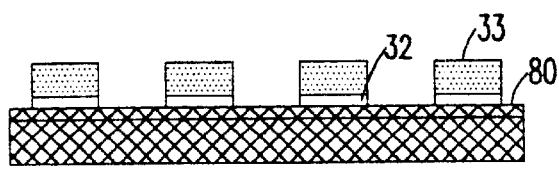
Figure 3E:
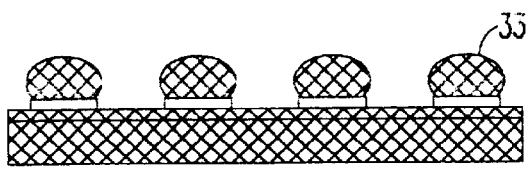
Figure 3F:
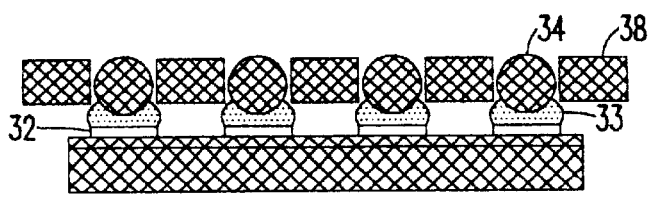

The triple stacked solder bump in accordance with the invention includes three basic processes: stencil printing, solder ball placement and reflow, each of which is individually well-understood in the art. Referring to FIG. 3C, a stencil or mask 36 is applied to the surface on which the triple stacked solder bumps are to be formed and on which structures 30, 31 and 32 are already in place. The inner bump 33 is developed by screening (81, FIG. 3H) solder paste through the stencil onto the UBM 32 with a nozzle, squeegee or the like 37. The stencil 36 is then removed (82) and the pattern of solder paste thus transferred to the surface 80 is prebaked (82) to stabilize the solder paste forms as shown in FIG. 3E.

Figure 3G:
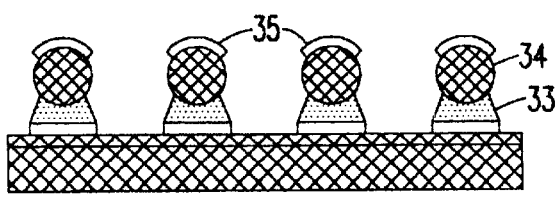
Figure 3H:
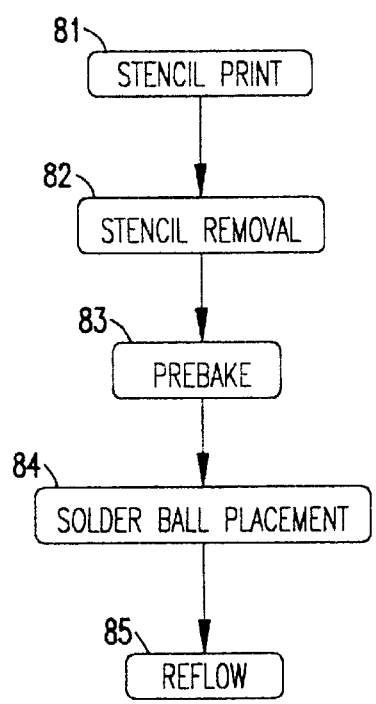
FIG. 3H is a flow chart illustrating the process of FIGS. 3C–3G.

The application of the middle bump is straight forward wherein a stencil or apertured plate 38 and corresponding to the pattern of stencil/mask 36 is applied above the inner bumps 33 and solder balls 34 of increased melting point relative to the inner bump solder material in the paste are inserted (84) into the apertures and pressed against the inner bumps. The assembly is then heated (either before or after removal of stencil/apertured plate 38) to a temperature between the melting points of the inner bump and the solder balls 34 in order to reflow and reform (85) the inner bump and form bonds to both the UBM 32 and the solder ball 34 while solder ball 34 regulates the height of the triple stacked solder bump, as shown in FIG. 3G. The material for the outer bump 35 may be applied by screening or plating onto the solder ball/middle bump 34 or, preferably, by application of solder material by any method to the opposing surface to be bonded.

Figure 4:
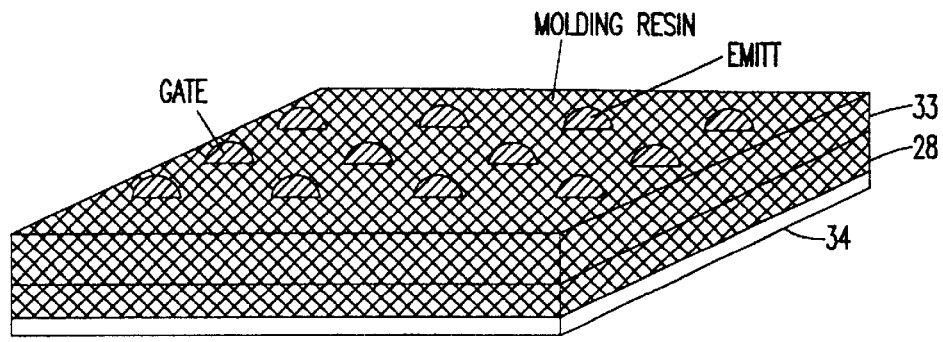
FIG. 4 is an isometric and partially cut-away view of a generalized device including solder bumps for bonding in accordance with the invention.

The region surrounding the solder bumps of FIGS. 3A and 3B is indicated as underfill. However, in accordance with a preferred form of the invention, a portion of the region can be filled with a molding resin 33, as shown in FIG. 4, leaving only a relatively low profile portion of the solder bumps protruding above the surface.

Figure 5A:
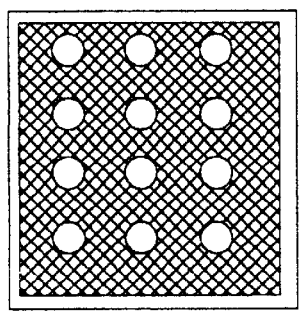
FIGS. 5A and 5B are perspective views of an exemplary IGBT and integrated circuit device including solder bumps for bonding in accordance with the invention.
Figure 5B:
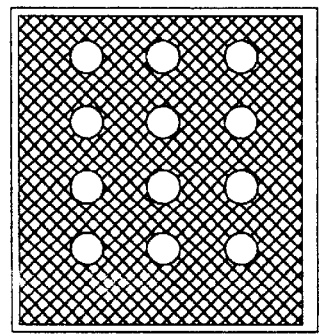

This feature provides additional close encapsulation of the solder bumps to improve electrical and mechanical properties thereof, particularly at high temperatures. Chip scale packaging of the power devices can be limited to this feature or other features such as a thermally conductive layer or plate 34 and/or a protective plate or layer may be applied, as may be desired. The only criterion for such additional features is that the heat transfer capabilities of the power device should not be significantly compromised or diminished. An exemplary IGBT and an integrated circuit device formed in this manner are shown in FIGS. 5A and 5B, respectively.

Figure 6:
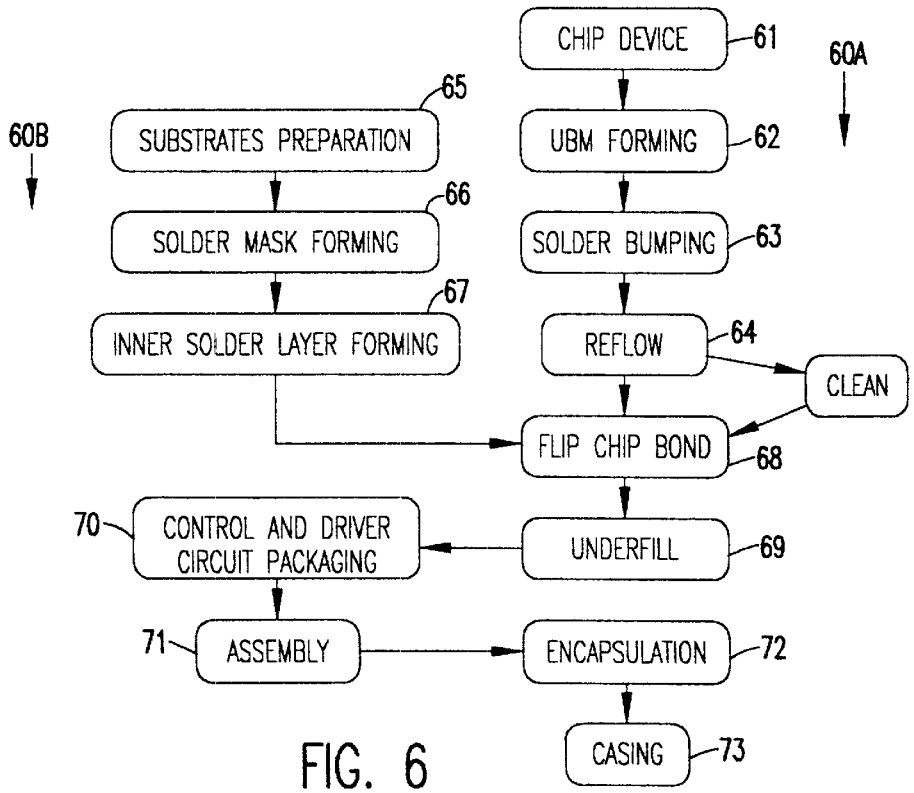
FIG. 6 is a flow diagram illustrating the process flow for manufacture of the package structures of FIGS. 1 and 2, and FIGS. 7A, 7B and 7C graphically depict a comparison of electrical performance of the invention and prior known packaging techniques.

Referring now to FIG. 6, the process for manufacturing the package of FIG. 1 or 2 or variants thereof will be discussed. The initial stages of the process can proceed in parallel as indicated by arrows 60a (chip preparation) and 60b (board preparation) before the board and chips are assembled and bonded together.

Following path 60a, the details of the chip manufacturing process, depicted at 61, are not important to the practice of the invention since the invention is applicable to any type of semiconductor device or integrated circuit formed with any chip design. However, the chip manufacture should conclude with application of under-bump metal, as described above as depicted at 62. As depicted at 63 and 64, solder materials for forming the solder bumps is applied and the solder reflowed to form the solder bumps in a manner appropriate to the type of solder bumps employed. The completed chips can then be cleaned as shown at 64a and otherwise prepared for assembly.

Following path 60b, the substrates are prepared by lamination and patterning as illustrated at 65. Depending on the type of solder ball and bonding process employed, solder can be applied to the substrates with a mask and a patterned layer of solder formed on the inner surface 16 (FIGS. 1 and 2) of the substrate, as shown at 66 and 67, respectively. Connections or passive components 27 (FIG. 1) such as metal posts, if needed, can also be formed or applied as part of this process.

The flip chip bonding of the chips to the second substrate is then performed as illustrated at 68. when the chips have been thus attached to the second substrate, underfill material is applied to fill interstices between the ball bonds. Curing of the underfill material can be performed at any time thereafter. Then as illustrated at 70 and 71, the control, sensor, protection and/or driver circuits can be added and the second substrate assembled to the first substrate. It should be noted that the order of these two steps is not important in the embodiment of FIG. 1. In regard to the embodiment of FIG. 2, it may be desirable to reverse the order of steps 69 and 70 in order to apply underfill to the low power circuits as well as the power chips.

Once the first substrate and second substrate are assembled together, encapsulant can be placed into the voids around the chips between the substrates. It is also possible to apply a layer of encapsulant over the chips on the second substrate prior to assembly with the first substrate in order to assure good filling of the voids. Finally, power bus connections 13, 13' and a casing 29 are applied as necessary to complete the IPEM.

Figure 7A:
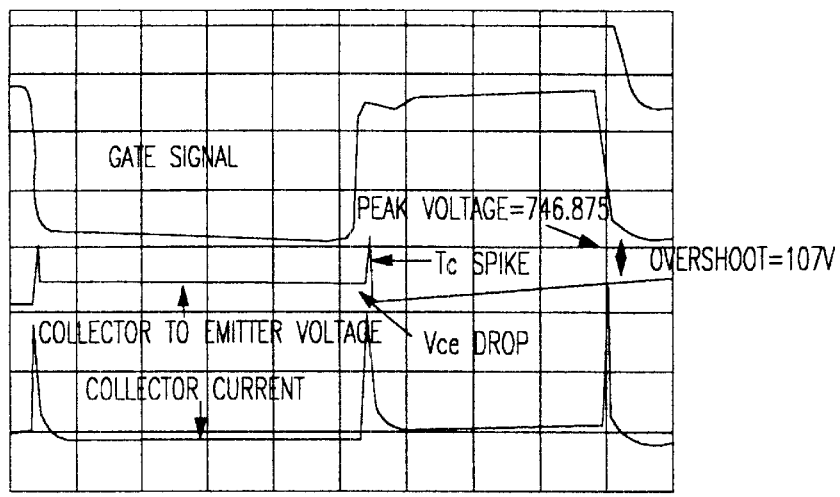
Figure 7B:
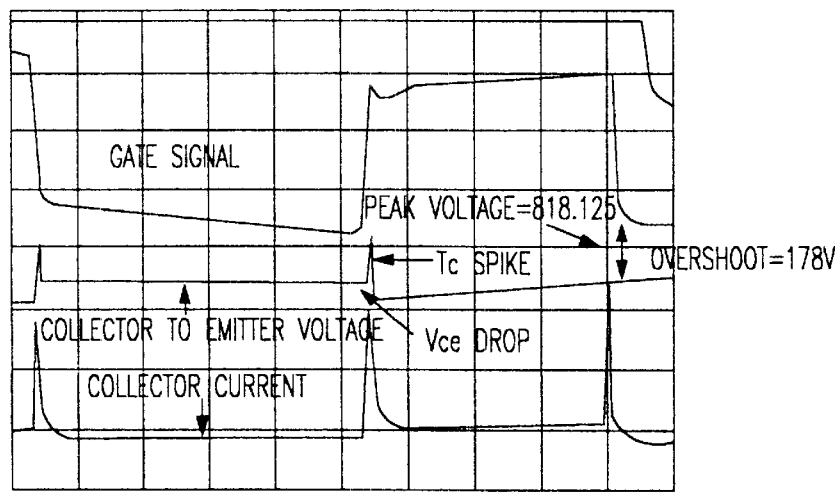
Figure 7C:
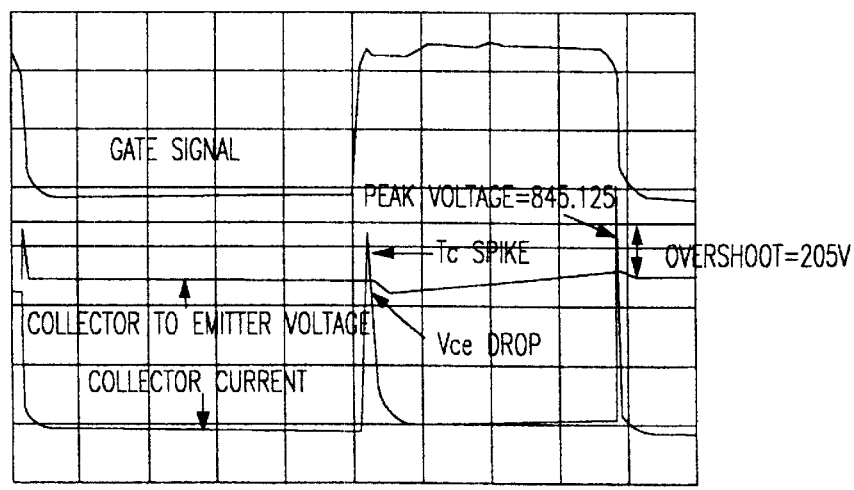

The development of improvements in performance provided in accordance with the invention are evident from FIG. 7A showing the performance of a flip-chip IPEM (FC-IPEM) or flip-chip on flex IPEM (FCOF_IPEM) depending on compliance or flexibility of the substrate 11 and/or 16 in accordance with the invention when compared to FIGS. 7B and 7C which represent performance of a comparable commercially available wire bond packaged IGBT device (FIG. 7B) and a comparable commercially available wire bond packaged power module (FIG. 7C), all switching 640 volts at 50 amperes. The shape of the turn-on waveform is slightly improved, yielding somewhat enhanced switching speed.

More importantly, however, in the turn-off characteristic, the FC-IPEM/FCOF-IPEM in accordance with the invention shows an overshoot of 107 volts whereas the commercially available IGBT device exhibits an overshoot of 178 volts and the commercially available power module exhibits an overshoot of 205 volts. Referred to the bus voltage that is switched, the FC-IPEM/FCOF-IPEM of the invention exhibits an overshoot of about 16.5% whereas the wire bond packaged power module exhibits an overshoot of about 32%. Thus, the overshoot (which is important since it can cause operating limits of the module to be exceeded; resulting in breakdown and possible destruction of the module as well as high losses) is nearly halved by the packaging in accordance with the invention.

It should be recognized that this overshoot is a measure of the inductance contributions of both the power devices and the package and the reduction of overshoot by virtue of the invention is also a measure of the reduction in package resistance and inductance to negligible levels as a result of the invention. In this regard, it should also be appreciated that high voltage rating devices which may be used where overshoot is likely to result in damage or destruction of the device are substantially more expensive and are associated with high conduction losses and low overall efficiency.

In regard to reliability, tests on commercially available wire bond packages showed some significant increase in resistance after about three thousand thermal cycles from 0° C. to 100° C., indicating onset of degeneration and eventual failure of the wire bonds. Tests on comparable FC-IPEMs/FCOF-IPEMs in accordance with the invention have not revealed any measurable increase in resistance over much larger numbers of thermal cycles over the same temperature range.

In view of the foregoing, it is seen that the invention provides a low-cost package for power semiconductor devices of all types which significantly improves the performance thereof by reducing resistive and inductive package parasitics to negligible levels while greatly enhancing reliability. The process for forming the package is relatively simple and non-critical with large process windows that do not compromise manufacturing yield. Stacked solder balls of different materials provide a compliant connection of increased reliability and shape control. The resistance and inductance of the package are reduced to negligible levels far below that of current power chips and thus the invention will support future performance improvements in foreseeable generations of power chips. Size reductions and increased control and protection arrangement complexity are accommodated by a compact package providing excellent thermal performance and mechanical support for chips and connections thereto.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. An integrated power electronic module including:
   a first substrate,
   a second substrate,
   power semiconductor devices attached and electrically connected to said second substrate with ball bonds, said ball bonds having an hour glass configuration formed from a ball and inner and outer solder layers connected to pads on said second substrate and said power semiconductor device, respectively,
   underfill having a glass transition temperature above a service temperature of said power semiconductor device located adjacent said ball bonds and between a base of said power semiconductor device and said second substrate,
   said first substrate with said second substrate and said power semiconductor devices being connected together in a configuration where said power semiconductor devices are sandwiched between said first substrate and said second substrate,
   encapsulant positioned between power semiconductor devices and said first and second substrates, and
   means for removing heat from said power semiconductor devices associated with at least one of said first and second substrates.

2. A module as recited in claim 1, further including
   at least one further semiconductor chip connected to a side of said second substrate opposite to said power semiconductor device.

3. A module as recited in claim 1, further comprising a first and a second heat spreading device attached to said first and second substrate, respectively.

4. A module as recited in claim 3, wherein said second heat spreading device includes a heat sink.

5. A module as recited in claim 1, wherein said first heat spreading device includes a heat sink.

6. A module as recited in claim 1, wherein said first and second substrates are laminates of insulator and metal.

7. A module as recited in claim 1 further comprising a metal layer on a surface of one of said first and second layers, wherein said metal layer is patterned.

8. A module as recited in claim 1, further comprising a heat spreading device attached to one of said first and second substrates.

9. An integrated power electronic module including:
   a first substrate;
   a second substrate;
   a wiring pattern on at least one of said first and second substrates, said wiring pattern extending to a marginal edge of said one of said first and second substrates;
   power semiconductor devices attached to and electrically connected with said wiring pattern, said first substrate with said second substrate and said power semiconductor devices being connected together in a configuration where said power semiconductor devices are sandwiched between said first substrate and said second substrate; and
   a power bus connected to said wiring pattern at said marginal edge of said wiring pattern.

10. A module as recited in claim 9 wherein said power semiconductor devices are attached and electrically connected with ball bonds, said ball bonds having an hour glass configuration formed from a ball and inner and outer solder layers connected to pads on said second substrate and said power semiconductor device, respectively.

* * * * *